United States Patent
Reischl et al.

(10) Patent No.: US 10,641,793 B2
(45) Date of Patent: May 5, 2020

(54) CONTACT PIN AND TEST BASE HAVING CONTACT PINS

(71) Applicant: Rosenberger Hochfrequenztechnik GmbH & Co. KG, Fridolfing (DE)

(72) Inventors: Stefan Reischl, Ainring (DE); Ludwig Huber, Fridolfing (DE)

(73) Assignee: ROSENBERGER HOCHFREQUENZTECHNIK GMBH, Fridolfing (DE)

( * ) Notice: Subject to any disclaimer, the term of this patent is extended or adjusted under 35 U.S.C. 154(b) by 78 days.

(21) Appl. No.: 16/092,771

(22) PCT Filed: Apr. 7, 2017

(86) PCT No.: PCT/EP2017/000445
§ 371 (c)(1),
(2) Date: Oct. 11, 2018

(87) PCT Pub. No.: WO2017/178105
PCT Pub. Date: Oct. 19, 2017

(65) Prior Publication Data
US 2019/0137545 A1    May 9, 2019

(30) Foreign Application Priority Data
Apr. 13, 2016  (DE) .......... 10 2016 004 520

(51) Int. Cl.
*G01R 1/067* (2006.01)
*G01R 31/00* (2006.01)
(Continued)

(52) U.S. Cl.
CPC ....... *G01R 1/07357* (2013.01); *G01R 1/0466* (2013.01); *G01R 1/06716* (2013.01);
(Continued)

(58) Field of Classification Search
CPC ............ G01R 1/07357; G01R 1/07342; G01R 1/06727; G01R 3/00; G01R 1/06733; G01R 1/06716; G01R 1/07314; G01R 1/06738
(Continued)

(56) References Cited

U.S. PATENT DOCUMENTS 5,764,072 A    6/1998  Kister
6,034,534 A    3/2000  Kiyota
(Continued)

FOREIGN PATENT DOCUMENTS

CN    101031804 A    9/2007
EP    0621484 A1    10/1994
(Continued)

OTHER PUBLICATIONS

Machine translation of JPH0447689A.

*Primary Examiner* — Raul J Rios Russo
(74) *Attorney, Agent, or Firm* — David P. Dickerson

(57) ABSTRACT

A contact pin (100; 10012, 10032) for electrically connecting a first electrical contact area (13), which is arranged on a device under test (300) to be surveyed, and a second electrical contact area (17), which is arranged in a test base (200; 200'), has an elongate central region (1) which is mechanically connected to the test base (200; 200'), has a first spring arm (21), the first end (41) of which is connected to a first end (5) of the central region (1) and the second end (111) of which has a first contact region (12) for electrical contact-connection to the first electrical contact area (13), and has a second spring arm (31), the first end (61) of which is connected to a first or second end (5, 7) of the central region (1) and the second end (151) of which has a second contact region (16) for electrical contact-connection to the second electrical contact area (17). The first and the second spring arm (21, 31) are each oriented, in the region of their
(Continued)

first end (41, 61), at an angle (ϕ1, ϕ2) in relation to a longitudinal axis (9) of the central region (1), which angle is smaller than or equal to 90°.

21 Claims, 9 Drawing Sheets

(51) Int. Cl.
*G01R 1/073* (2006.01)
*G01R 1/04* (2006.01)
*H01R 13/24* (2006.01)
*G01R 3/00* (2006.01)
*G01R 31/28* (2006.01)

(52) U.S. Cl.
CPC ..... *G01R 1/06727* (2013.01); *G01R 1/06733* (2013.01); *G01R 1/06738* (2013.01); *G01R 1/07314* (2013.01); *G01R 1/07342* (2013.01); *G01R 3/00* (2013.01); *G01R 31/2886* (2013.01); *H01R 13/2442* (2013.01); *G01R 1/0433* (2013.01); *H01R 2201/20* (2013.01)

(58) Field of Classification Search
USPC ......... 324/71, 378, 403, 415, 425, 500, 537, 324/755.01, 755.04, 755.06
See application file for complete search history.

(56) References Cited

U.S. PATENT DOCUMENTS

| | | |
|---|---|---|
| 6,491,968 B1 | 12/2002 | Mathieu et al. |
| 2002/0160632 A1 | 10/2002 | Maldonado et al. |
| 2004/0157476 A1 | 8/2004 | Maldonado et al. |
| 2005/0118889 A1* | 6/2005 | Mendenhall ....... H01R 13/2435 439/838 |
| 2005/0179458 A1 | 8/2005 | Chen et al. |
| 2008/0045044 A1* | 2/2008 | Yi ......................... H01R 12/52 439/65 |
| 2008/0258746 A1 | 10/2008 | Tran et al. |
| 2010/0041254 A1* | 2/2010 | Hsu ..................... H05K 7/1046 439/73 |
| 2014/0327461 A1 | 11/2014 | Fan et al. |

FOREIGN PATENT DOCUMENTS

| | | |
|---|---|---|
| EP | 0906007 A2 | 3/1999 |
| EP | 0966687 A1 | 12/1999 |
| EP | 1200992 B1 | 7/2001 |
| EP | 1496574 A2 | 1/2005 |
| EP | 2919020 A1 | 9/2015 |
| JP | H07-47689 A | 2/1992 |
| WO | 2014/003003 A1 | 1/2014 |

* cited by examiner

CONTACT PIN AND TEST BASE HAVING CONTACT PINS

FIELD OF THE INVENTION

The invention relates to a contact pin and to a test base which contains a plurality of contact pins.

BACKGROUND OF THE INVENTION

Automatic test equipment (ATE), in which integrated circuits are checked in respect of correct functioning thereof, substantially consists of a measuring device, for example a network analyzer, a so-called loadboard which constitutes a printed circuit board as an application-specific interface between the universally usable measuring device and the integrated circuit as an application-specific device under test (DUT), and an automatic handling machine which inserts the integrated circuit into a test base which is mounted on the loadboard, presses it onto the test base and removes it again.

For complete and correct testing of the integrated circuit, the test base has a specific number of contact pins which are typically respectively arranged in two or four rows and which each form an optimum electrical connection between a contact area of the integrated circuit to be tested—referred to as the first contact area in the text which follows—and an associated contact area which is located on the test base—referred to as the second contact area in the text which follows.

EP 0 906 007 B1 discloses a contact pin of this kind which connects the contact area of an integrated circuit to be surveyed to the contact area of the test base.

A contact pin of this kind has two elastic regions with which two electrical connections between the contact pin and in each case one of the two contact areas can be achieved, in each case independently of one another.

Since the contact areas of integrated circuits are produced from tin or other conductive contact materials, layers can disadvantageously form on these contact areas owing to, for example, oxidation over time, said layers impairing the electrical contact between the contact area and the associated contact region of the contact pin. Owing to a frictional movement of the two contact regions of the contact pin, which frictional movement runs parallel in relation to the contact areas in each case and occurs when the device under test to be tested is inserted into the test base, particles are removed from these, for example, tin oxide layers and therefore electrical contact is re-established or improved in each case.

However, the contact pin of EP 0 906 007 B1 disadvantageously has a comparatively large physical extent. In the context of increasing miniaturization of integrated circuits, a contact pin of this kind is not suitable.

BRIEF SUMMARY OF THE INVENTION

The object of the invention is therefore to provide a contact pin and a test base containing these contact pins, which contact pin and test base overcome this disadvantage.

This object is addressed by the embodiments recited in the independent claims. Further embodiments are recited in the dependent claims.

The present disclosure teaches a contact pin having a central region and two spring arms as elasticities. The first and the second spring arm, by way of their first end, are each connected to the central region and, at their second end, each have a contact region for electrical contact-connection to the first contact area of the device under test to be surveyed and, respectively, to the second contact area of the test base. In the text which follows, the contact region of the first spring arm is referred to as the first contact region, and the contact region of the second spring arm is referred to as the second contact region.

In order to configure the contact pin according to the invention in as space-saving a manner as possible, the first end of the first spring arm is connected to a first end of the central region which is of substantially elongate design, and the first end of the second spring arm is connected to the first end or to the second end of the central region. In addition, the first and the second spring arm, in the region of their first end, are each oriented at an angle in relation to the center axis of the central region, which angle is smaller than or equal to 90°.

Both technical measures advantageously make it possible for the contact pin, by way of its two spring arms, the lengths of which in each case most importantly influence the extent of the contact pin for functional reasons, to have a minimized geometric volume.

In addition, a miniaturized contact pin has shorter signal paths and therefore additionally optimizes the high-frequency transmission characteristic of the contact pin.

In a preferred variant, the first and the second spring arm, by way of their first ends, are each connected to the central region at a different end of the central region. As an alternative, a second variant can also be realized, in which the first and the second spring arm, by way of their first ends, are each connected to the central region at the same end of the central region.

In order to further shorten the length of the first and the second spring arm for further miniaturization of the contact pin according to the invention while maintaining the total elasticity of the contact pin, further first spring arms and/or further second spring arms are preferably connected to the central region parallel in relation to the first and the second spring arm in a first enhancement of the contact pin according to the invention. The spring arms taper in the direction of the contact regions. The first spring arm, the second spring arm and the further first and second spring arms are advantageously spaced apart from one another by a slot in each case here, said slot typically having the same order of magnitude as the average width of the spring arms in the LIGA (German abbreviation for lithography, electroplating and molding) process used for the contact pin. Slots which are considerably smaller than the average width of the spring arms can also be realized when using a different manufacturing process.

The second ends of the further first and second spring arms are connected to the first spring arm and, respectively, to the second spring arm when the device under test to be tested is pushed into the test base by a punch of the automatic handling machine.

In order to increase the mechanical stability of the contact pin according to the invention, the second ends of the further first spring arms and of the further second spring arms are connected to a lateral widened portion of the second end of the first and, respectively, the second spring arm by means of plug-in connection in a second enhancement of the invention.

To this end, in a first sub-variant of the second enhancement of the invention, the second ends of the further first spring arms and of the further second spring arms are each formed as pin-like widened portions which are introduced and inserted into associated recesses in the lateral widened portion of the second end of the first spring arm and, respectively, of the second spring arm.

In a second sub-variant of the second enhancement of the invention, the second ends of the further first spring arms and of the further second spring arms each have a recess into which associated additional pin-like widened portions are introduced and inserted, said associated additional pin-like widened portions being formed in the lateral widened portion of the second end of the first spring arm and, respectively, of the second spring arm.

Instead of a fixed connection between the first ends of the further first and of the further second spring arms and the central region, it is alternatively also possible, in a third enhancement of the invention, for a plug-in connection to be realized between the first ends of the further first and of the further second spring arms and the central region:

In a first sub-variant of the third enhancement of the invention, the first ends of the further first and second spring arms are formed as pin-like widened portions which are introduced and inserted into associated recesses of the central region. As an alternative, in a second sub-variant of the third variant according to the invention, pin-like widened portions are formed in the central region, said pin-like widened portions being introduced and inserted into associated recesses at the first ends of the further first and second spring arms.

Additional mechanical stabilization of the spring pin is preferably implemented in a fourth enhancement of the invention by an additional plug-in connection being realized between the lateral widened portion of the second end of the first spring arm and the second end of the central region and/or between the lateral widened portion of the second end of the second spring arm and the second end or the first end of the central region in each case. Here, the high-frequency transmission characteristic of the contact pin is advantageously additionally improved since an additional shortened signal path is in each case created by means of these two plug-in connections.

In a first sub-variant of the fourth enhancement of the invention, the lateral widened portion of the second end of the first spring arm and/or of the second spring arm has a recess in each case, wherein the lateral pin-like widened portion of the second end of the central region is introduced and inserted into the recess at the second end of the first spring arm and/or the lateral pin-like widened portion of the second end or of the first end of the central region is introduced and inserted into the recess at the second end of the second spring arm.

As an alternative, in a second sub-variant of the fourth enhancement of the invention, the lateral widened portion of the second end of the first spring arm and/or of the second spring arm is formed in a pin-like manner, wherein the pin-like lateral widened portion of the second end of the first spring arm is introduced and inserted into an associated recess which is formed at the second end of the central region and/or the pin-like lateral widened portion of the second end of the second spring arm is introduced and inserted into an associated recess which is formed at the second or first end of the central region.

In a first embodiment, the individual first and second spring arms each preferably run in a linear manner since, in this first embodiment, the combination of minimized volume and maximized elasticity is optimized as long as further first and second spring arms are provided.

In a second embodiment of spring arms, the individual first and second spring arms each run in a concavely bent manner in relation to the central region. A slightly higher elasticity is achieved here since the spring arms are slightly longer, while the required volume is slightly increased in comparison to the first embodiment.

In a third embodiment of spring arms, the individual first and second spring arms each have a convexly bent profile in relation to the central region. The required volume is lowest in this form of a contact pin. However, the elasticity of the contact pin is considerably poorer since, in this form, only a few further first and second spring arms can be realized, and these are additionally of considerably shorter form.

As part of a fourth embodiment, the first and second spring arms are formed in a meandering manner. On account of the meandering shape, the first and spring arms have the greatest length in each case. The fourth embodiment of a contact pin is suitable for applications which require a considerably lower width with lower requirements in terms of height.

In order to achieve as good an abrasion process as possible between the first contact region of the contact pin and the first contact area on the device under test and at the same time as slight an abrasion process as possible between the second contact region of the contact pin and the second contact area on the test base, the angle between an axis which runs between the first and the second end of the first spring arm and the longitudinal axis of the central region is designed to be significantly larger than the angle between an axis which runs between the first and second end of the second spring arm and the longitudinal axis of the central region.

The angle between the axis which runs between the first and the second end of the first spring arm and the longitudinal axis of the central region is larger, for example, by a factor of 1.5 than the angle between the axis which runs between the first and the second end of the second spring arm and the longitudinal axis of the central region. The angle between the axis which runs between the first and the second end of the first spring arm and the longitudinal axis of the central region is preferably larger by a factor of 2.0 than the angle between the axis which runs between the first and the second end of the second spring arm and the longitudinal axis of the central region. The angle between the axis which runs between the first and the second end of the first spring arm and the longitudinal axis of the central region is particularly preferably larger by a factor of 2.5 than the angle between the axis which runs between the first and the second end of the second spring arm and the longitudinal axis of the central region.

The larger angle between the axis which runs between the first and the second end of the first spring arm and the longitudinal axis of the central region in comparison to the angle between the axis which runs between the first and the second end of the second spring arm and the longitudinal axis of the central region causes, given approximately the same length of the first and second spring arms, a movement of the first contact region in the parallel direction in relation to the first contact area, which movement is greater than the movement of the second contact region in the parallel direction in relation to the second contact area.

The longer movement of the first contact region at the first contact area in comparison to the movement of the second contact region at the second contact area causes scraping off of, for example, tin oxide particles at the first contact area over a larger surface area, in particular scraping off of, for example, tin oxide particles in the region of the contact tip of the contact region, which contact tip forms the electrical contact to the first contact area.

A number of contact pins according to the invention which corresponds to the number of first contact areas of the DUT is arranged in the test base according to the invention.

The arrangement of the contact pins according to the invention is typically performed analogously to the arrangement of the first contact areas in the case of an integrated circuit in two or four rows which are arranged in a manner offset with a specific offset in relation to the position of the two or four sides of the rectangular base area of the integrated circuit. A different arrangement of contact pins according to the invention within a test base according to the invention, for example in a grid or matrix arrangement, and any arrangement of contact pins according to the invention used in the future are likewise possible and also covered by the invention.

The individual contact pins according to the invention are mechanically connected to the test base according to the invention by means of at least one fastening apparatus in each case and are each in electrical contact with associated second contact areas of the test base according to the invention.

As an alternative, the individual contact pins according to the invention can also be integrated in a module which can be detached from the test base according to the invention. Finally, the individual contact pins according to the invention of a single row can be integrated in a module which can likewise be detached from the test base according to the invention.

BRIEF DESCRIPTION OF THE DRAWINGS

The individual embodiments, variants, sub-variants and enhancements of the contact pin according to the invention and of the test base according to the invention will be explained in detail below with reference to the drawing. In the figures of the drawing.

DETAILED DESCRIPTION OF THE INVENTION

The individual embodiments, variants, sub-variants and enhancements of the contact pin according to the invention will be explained in detail below with reference to the figures:

The contact pin according to the invention constitutes a micromechanical component. The contact pin according to the invention is preferably produced by means of a LIGA process. In addition, other micromechanical processes are likewise possible for producing the contact pin according to the invention and are also covered by the invention.

On account of the micromechanical process, the contact pin according to the invention has a primarily two-dimensional geometry (height and width of the contact pin according to the invention) given a homogeneous thickness. The height and width of the contact pin according to the invention each typically lie between one and three millimeters, while the thickness is typically approximately one tenth of a millimeter.

In a preferred application of the LIGA process, the contact pin according to the invention is typically composed of a metal, metal alloys or connection systems which are composed of metallic and non-metallic elements, for example NiP. The side faces at the transitions between the top side and bottom side of the contact pin according to the invention which is primarily oriented in respect of height and width is provided with a coating, for example a gold coating.

Figure 1:
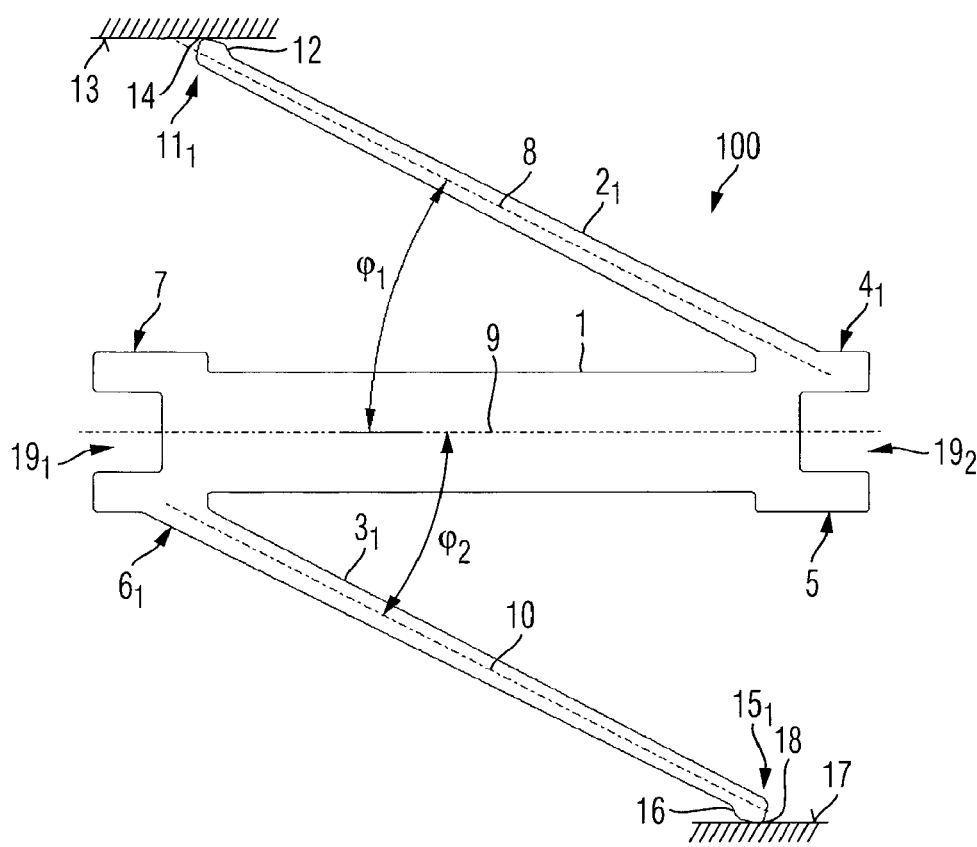
FIG. 1 shows an illustration of a contact pin according to the invention with a linearly running spring arm on each contact side.

In a first, highly simplified form of a contact pin 100 according to the invention in line with FIG. 1 which shows a two-dimensional illustration of the contact pin in terms of the dimensions height and width, the contact pin 100 according to the invention consists of an elongate central region 1, a first spring arm 21 and a second spring arm 31. The first and the second spring arm 21 and 31 each have an elongate linear shaped portion, the width of which is typically embodied to be smaller than the width of the central region 1 in each case.

The first spring arm 21, at its first end 41, is connected to a first end 5 of the central region 1—to that end of the central region which is illustrated on the right-hand side in FIG. 1. The second spring arm 31, at its first end 61, is connected to the second end 7 of the central region 1—to that end 7 of the central region 1 which is illustrated on the left-hand side in FIG. 1.

The first and second spring arms 21 and 31 are respectively oriented at an angle $\phi 1$ and, respectively, $\phi 2$, which is smaller than or equal to 90° in relation to the central region 1, in the region of their first end 41 and, respectively, 61. Here, the orientation angle $\phi 1$ between the first spring arm 21 in the region of its first end 41 and the central region 1 is given as the angle between a tangent from the first spring 21 in the region of its first end 41 and the longitudinal axis 9, which is located within the central region 1 of the central region 1, which angle, in the case of a linear first spring arm 21, corresponds to the angle between the longitudinal axis 8 of the first spring arm 21, that is to say the axis between the first end 41 and the second end 111 of the first spring arm 31, and the longitudinal axis 9, which is located within the central region 1 of the central region 1. The orientation angle φ2 is equivalently given as the angle between a tangent from the second spring 31 in the region of its first end 61 and the longitudinal axis 9 of the central region 1, which angle, in the case of a linear second spring arm 31, corresponds to the angle between the longitudinal axis 10 of the second spring arm 31, that is to say the axis between the first end 61 and the second end 151 of the second spring arm 31, and the longitudinal axis 9 of the central region 1.

A first contact region 12 is formed at the second end 111 of the first spring arm 21, which first contact region forms an electrical contact to an associated first contact area 13 of the device under test when the device under test to be surveyed, that is to say the integrated circuit to be surveyed, is in the state in which it is pushed into the test base.

As is clear from FIG. 1, this first contact region 12 preferably consists of a bead-like widened portion which points in the direction of the first contact area 13 and has a contact zone 14 which establishes the actual electrical contact with the first contact area 13 of the device under test.

In addition, the first contact region 12 has a raised portion or tip, not illustrated in FIG. 1, which, together with the first contact region 12, executes a slight translatory movement on the first contact area 13 when the device under test to be surveyed is inserted into the test base. On account of the spring force of the first spring arm 21 and the sharp-edged shape of the additional raised portion or tip, particles of an oxide layer on the first contact area 13 are scraped off owing to the translatory movement of the first contact region 12. This oxide layer on the first contact area 13 forms on account of oxidation over the course of time and impairs the electrical contact. By scraping off the particles of this oxide layer, the electrical contact between the first contact area 13 and the first contact region 12 of the first spring arm 21 is improved again.

A second contact region 16 is formed at the second end 151 of the second spring arm 31, which second contact region constitutes a bead-like widened portion which points in the direction of a second contact area 17 in the test base and has a contact tip 18. This contact tip 18 forms the actual electrical contact between the second contact region 16 of the second spring arm 31 and the second contact area 17 in the test base.

In order to mechanically fasten the contact pin 100 in the test base, at least one latching means is provided in the central region 1. In the illustration of FIG. 1, a latching means 191 and 192 is provided, for example, at each of the two ends of the central region 1, said latching means each forming an interlocking connection with a corresponding latching means in the test base. As an alternative to the interlocking connection, the invention also covers a force-fitting connection between the contact pin and the test base. Here, a contact means in the contact pin 100 or in the test base forms a force-fitting connection with a corresponding contact area in the test base or in the contact pin 100.

Owing to the spring force which is exerted by the first spring arm 21 of the contact pin according to the invention on the first contact area 13 of the device under test to be surveyed and by the second spring arm 31 on the second contact area 17 in the test base, an adequate electrical connection between the first contact area 13 of the device under test to be surveyed and the contact pin according to the invention and, respectively, between the contact pin 100 according to the invention and the second contact area 17 in the test base is guaranteed.

In order to shorten the length of the first spring arm 21 and of the second spring arm 31 and therefore additionally reduce the size of the contact pin 100 according to the invention, a contact pin 100 according to the invention has, in a first enhancement, further first spring arms 22 and 23 in addition to the first spring arm 21 and has further second spring arms 32 and 33 in addition to the second spring arm 31.

Figure 2A:
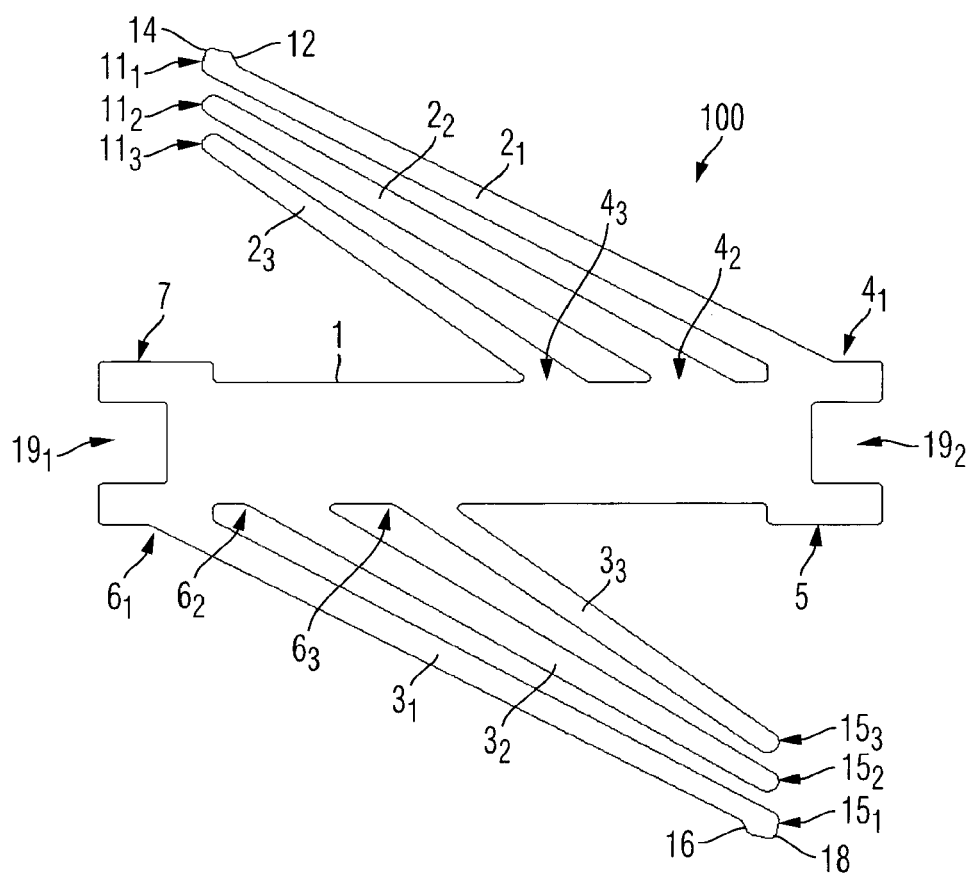
FIG. 2A shows an illustration of a first variant of a first enhancement of a contact pin according to the invention.

In a first sub-variant of the first enhancement of the contact pin 100 according to the invention in line with FIG. 2A, these further first spring arms 22 and 23 run parallel in relation to the first spring arm 21 and are connected by way of their first ends 42 and, respectively, 43 to the central region 1 at the first end 5 of the central region 1 and, respectively, adjacent to the first end 5 of the central region 1. The individual first spring arms 21, 22 and 23 are separated from one another by a slot in each case, the average width of said slot typically being of the order of magnitude of the average width of the individual first spring arms 21, 22 and 23.

The second spring arm 31 and the further second spring arms 32 and 33 also run parallel in relation to one another and are connected by way of their first ends 62 and 63 to the central region 1 at the second end 7 of the central region 1 and, respectively, adjacent to the second end 7 of the central region 1. The individual second spring arms 61, 62 and 63 are also separated from one another by a slot in each case, the average width of said slot typically being of the order of magnitude of the average width of the individual second spring arms 31, 32 and 33.

The number of parallel first and second spring arms is not restricted as in FIG. 2A. The invention also covers any other desired number of parallel first and, respectively, second spring arms as long as they can be connected to the central region 1 along the length of the central region 1 with the interposition of a respective slot.

Figure 2B:
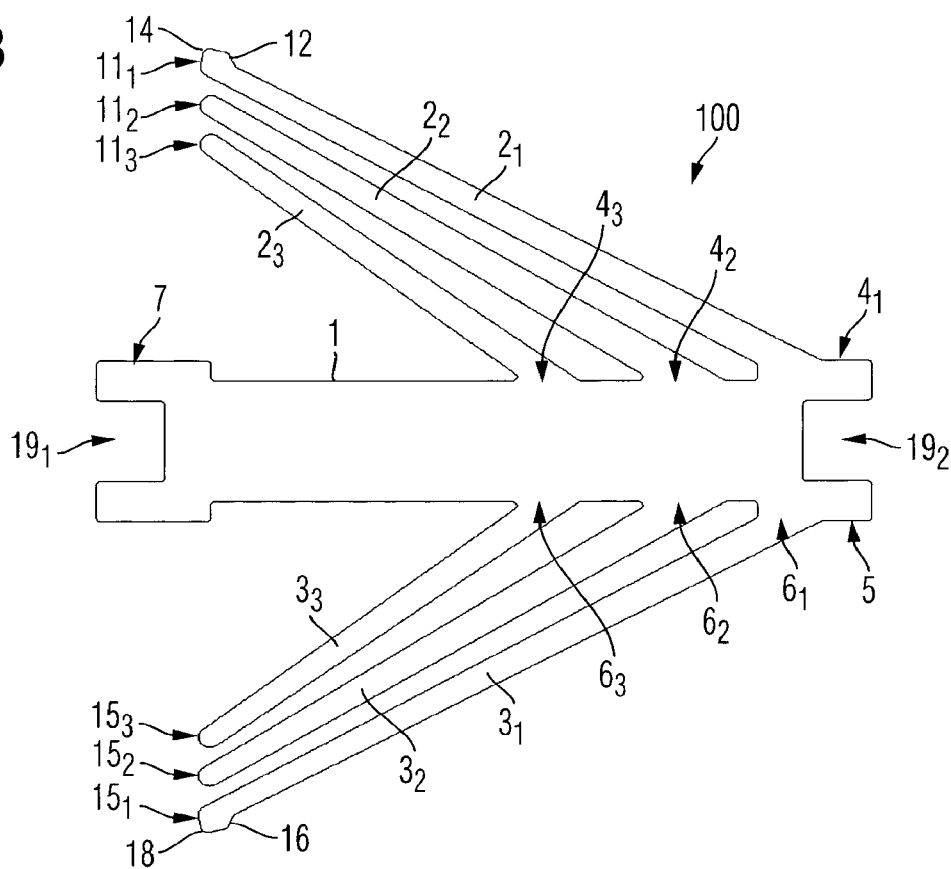
FIG. 2B shows an illustration of a second variant of a first enhancement of a contact pin according to the invention.

In a second sub-variant of the first enhancement of the contact pin 100 according to the invention which is illustrated in FIG. 2B, the second spring arm 31 and all of the further second spring arms 32 and 33 are connected to the central region 1 at the same end and, respectively, adjacent to the same end of the central region 1—specifically at the first end 5 and adjacent to the first end 5 of the central region 1—at which the first spring arm 21 and all of the further first spring arms 22 and 23 are also connected to the central region 1.

Figure 9:
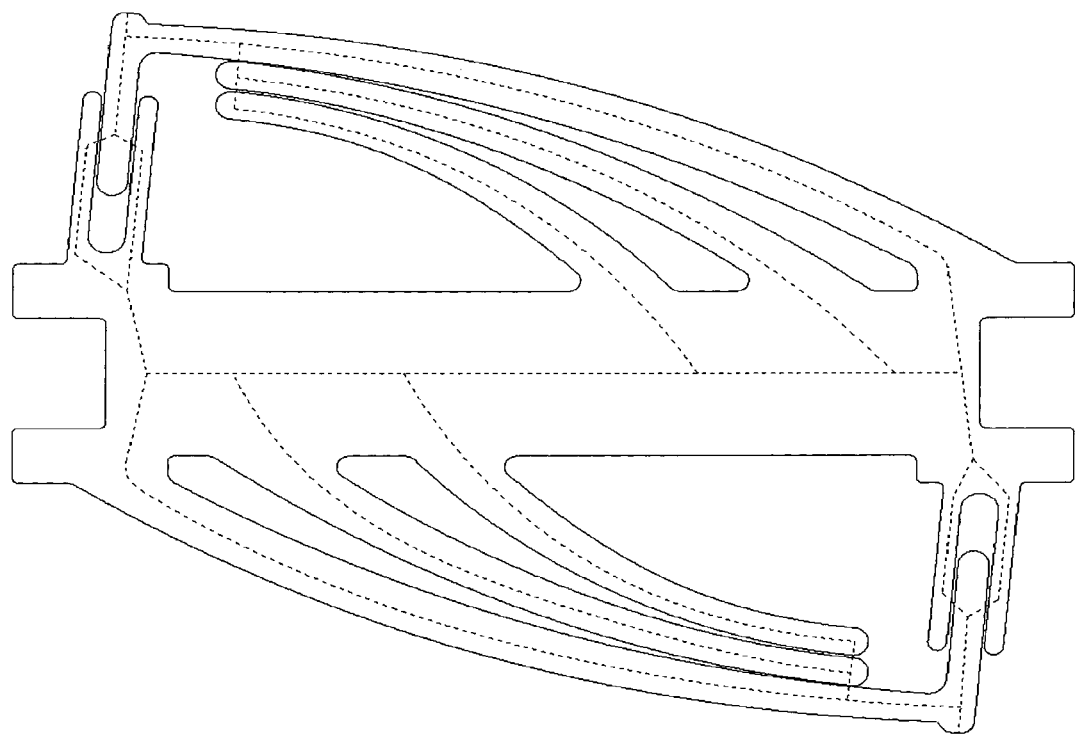
FIG. 9 shows an illustration of a contact pin according to the invention with individual signal paths.

In the first enhancement of the contact pin 100 according to the invention, all of the further first spring arms 22 and 23 and all of the further second spring arms 32 and 33 each have second ends 112, 113 and, respectively, 152, 153 which touch the first spring arm 21 and, respectively, the second spring arm 31 in the state in which the device under test to be surveyed is pushed into the test base, as is illustrated in FIG. 9. In this way, additional signal paths which additionally advantageously improve the high-frequency transmission behavior of the contact pin 100 according to the invention are created by means of the further first spring arms 22 and 23 and the further second spring arms 32 and 33.

In a second enhancement of the contact pin 100 according to the invention, the second ends 112, 113 and 152, 153 of the further first spring arms 22 and 23 and, respectively, further second spring arms 32 and 33 are in each case connected to a lateral widened portion of the second end 111 of the first spring arm 21 and, respectively, to a lateral widened portion of the second end 151 of the first spring arm 31.

Figure 3A:
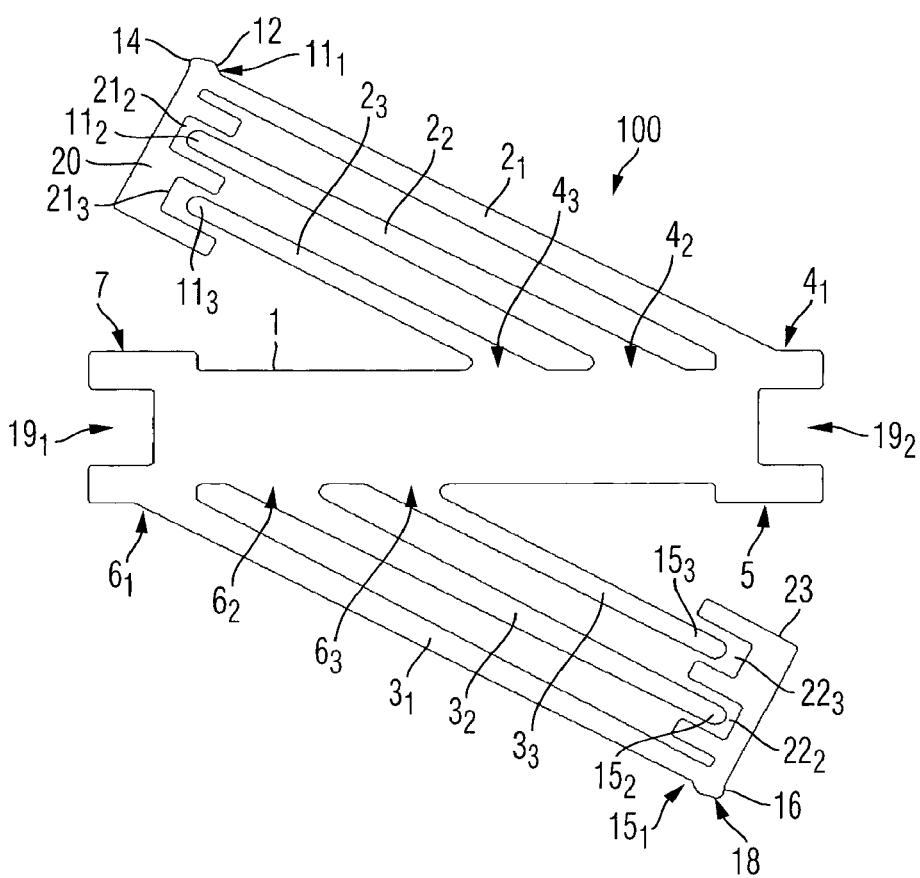
FIG. 3A shows an illustration of a first sub-variant of a second enhancement of a contact pin according to the invention.

To this end, in a first sub-variant of the second enhancement of the contact pin 100 according to the invention in line with FIG. 3A, the lateral widened portion 20 of the second end 111 of the first spring arm 21 respectively has a plurality of recesses 212 and 213 into which the second ends 112 and 113 of the further first spring arms 22 and 23 are introduced and inserted in each case. The second ends 112 and 113 of the further first spring arms 22 and 23 each form a plug-in connection with the associated recesses 212 and 213 in the lateral widened portion 20 of the second end 111 of the first spring arm 21. In this plug-in connection, the individual second ends 112 and 113 of the further first spring arms 22 and 23 are able to slide in an axial and radial manner to a certain extent in relation to the associated recesses 212 and 213. However, their axial and radial relative movement in relation to the associated recess 212 and 213 is limited.

In an equivalent manner to this, the second ends 152 and 153 of the further second spring arms 32 and 33 are each introduced and inserted into associated recesses 222 and 223 of a lateral widened portion 23 of the second end 151 of the second spring arm 31. The second ends 152 and 153 of the further second spring arms 32 and 33 each also form a plug-in connection with the associated recesses 222 and 223 of the lateral widened portion 23 of the second end 151 of the second spring arm 31.

Figure 3B:
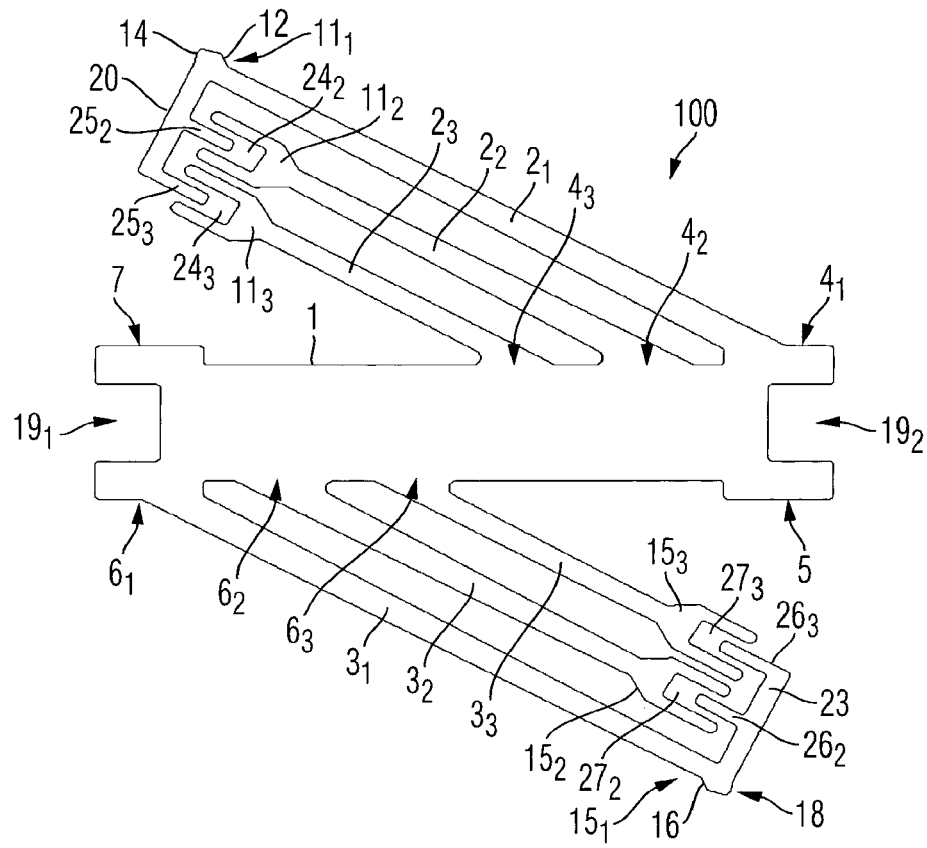
FIG. 3B shows an illustration of a second sub-variant of a second enhancement of a contact pin according to the invention.

In a second sub-variant of the second enhancement of the contact pin 100 according to the invention which is illustrated in FIG. 3B, the second ends 112 and 113 of the further first spring arms 32 and 33 each have a recess 242 and, respectively, 243. Associated pin-like widened portions 252 and, respectively, 253 of the lateral widened portion 20 of the second end 111 of the first spring arm 21 are introduced and inserted into these recesses 242 and 243. These pin-like widened portions 252 and, respectively, 253 are in turn oriented in an approximately lateral manner, that is to say at an angle of approximately 90°, in relation to the lateral widened portion 20 of the second end 111 of the first spring arm 21. The pin-like widened portions 252 and 253 each form a plug-in connection with the associated recesses 242 and, respectively, 243 at the second ends 112 and 113 of the further first spring arms 22 and 23.

In an equivalent manner, pin-like widened portions 262 and 263 on the lateral widened portion 23 of the second end 151 of the second spring arm 31 are introduced and inserted into associated recesses 272 and, respectively, 273 at the second ends 152 and, respectively, 153 of the further second spring arms 32 and, respectively, 33. These pin-like widened portions 262 and 263 are likewise oriented in an approximately lateral manner, that is to say at an angle of approximately 90°, in relation to the lateral widened portion 23 of the second end 151 of the second spring arm 31. The pin-like widened portions 262 and 263 likewise each form a plug-in connection with the associated recesses 272 and, respectively, 273 at the second ends 152 and, respectively, 153 of the further second spring arms 32 and, respectively, 33.

Figure 4A:
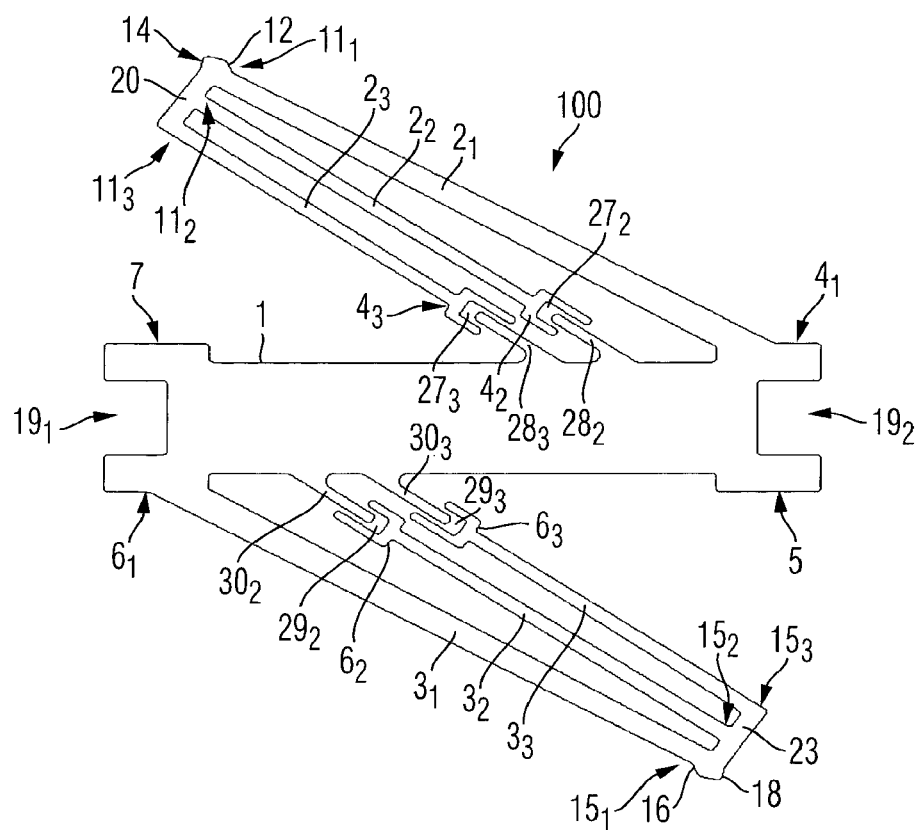
FIG. 4A shows an illustration of a first sub-variant of a third enhancement of a contact pin according to the invention.

In a third enhancement of the contact pin 100 according to the invention in line with FIG. 4A, the first ends of the further first and second spring arms each form a plug-in connection with the central region 1, while the second ends of the further first and second spring arms are each fixedly connected to the respective lateral widened portions of the second ends of the first and the second spring arm.

Here, in a first sub-variant of the third enhancement of the contact pin 100 according to the invention, the first ends 42 and 43 of the further first spring arms 22 and, respectively, 23 each have a recess 272 and, respectively, 273, while the second ends 112 and 113 of the further first spring arms 22 and, respectively, 23 are fixedly connected to the lateral widened portion 20 of the first end 111 of the first spring arm 21.

Associated lateral widened portions 282 and 283 of the central region 1 are introduced and inserted into the recesses 272 and 273 at the first ends 42 and 43 of the further first spring arms 22 and, respectively, 23. These lateral widened portions 282 and 283 have the same orientation as the further first spring arms 22 and 23 and protrude out of the central region 1 at suitable positions of the central region 1 adjacent to the first end 5 of the central region 1. This ensures that the further first spring arms 22 and 23 are arranged parallel in relation to the first spring arm 21 and in a manner spaced apart from one another by a slot in each case, the average width of which slot corresponds approximately to the average width of the individual first spring arms 21, 22 and 23. The lateral widened portions 282 and 283 of the central region 1 each form a plug-in connection with the associated recesses 272 and 273 at the first ends 42 and 43 of the further first spring arms 22 and, respectively, 23.

In an equivalent manner, the first ends 62 and 63 of the further second spring arms 32 and, respectively, 33 each have a recess 292 and, respectively, 293, while the second ends 152 and 153 of the further second spring arms 32 and, respectively, 33 are fixedly connected to the lateral widened portion 23 of the second end 151 of the second spring arm 31.

Associated lateral widened portions 302 and 303 of the central region are introduced and inserted into the recesses 292 and 293 at the first ends 62 and 63 of the further second spring arms 32 and, respectively, 33. These lateral widened portions 302 and 303 likewise have the same orientation as the further second spring arms 32 and 33 and protrude out of the central region 1 at suitable positions of the central region 1 adjacent to the second end 7 of the central region 1. These lateral widened portions 302 and 303 of the central region 1 each form a plug-in connection with the associated recesses 292 and 293 at the first ends 62 and 63 of the further second spring arms 32 and, respectively, 33.

Figure 4B:
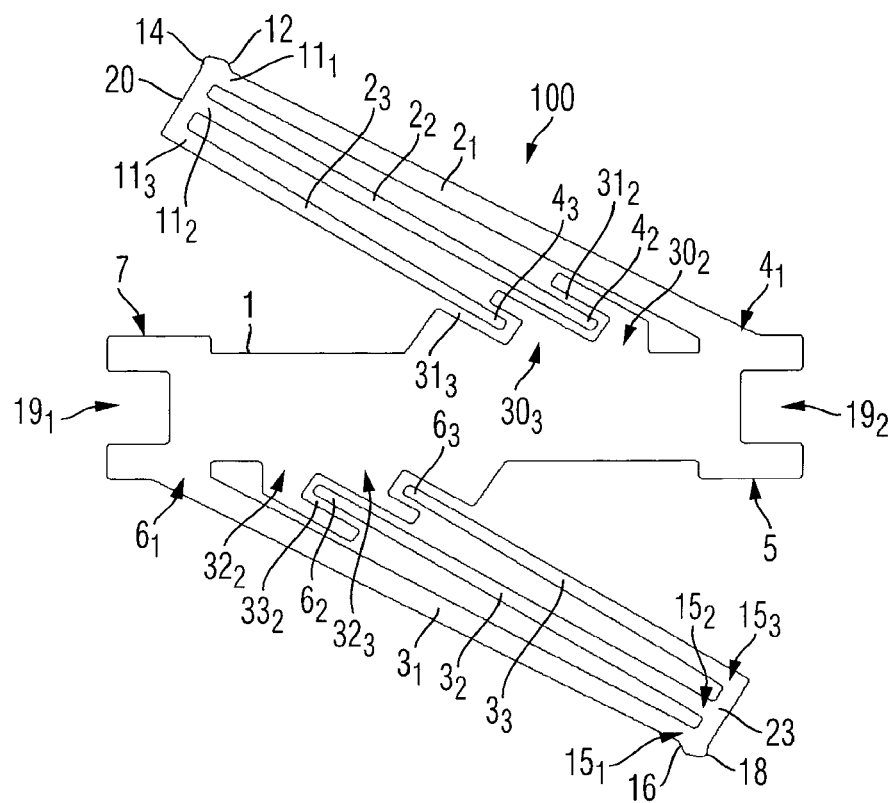
FIG. 4B shows an illustration of a second sub-variant of a third enhancement of a contact pin according to the invention.

In a second sub-variant of the third enhancement of the contact pin 100 according to the invention in line with FIG. 4B, the second ends 112 and 113 of the further first spring arms 22 and, respectively, 23 are fixedly connected to the lateral widened portion 20 of the first end 111 of the first spring arm 21, while the first ends 42 and 43 of the further first spring arms 22 and, respectively, 23 are introduced and inserted into associated recesses 312 and, respectively, 313 which are formed in lateral widened portions 302 and, respectively, 303 of the central region 1. These lateral widened portions 302 and 303 of the central region 1, by way of their recesses 312 and, respectively, 313, have approximately the same orientation as the associated further first spring arms 22 and 23 and protrude out of the central region 1 at suitable positions of the central region 1 adjacent to the first end 5 of the central region 1. This ensures that the further first spring arms 22 and 23 are arranged parallel to the first spring arm 21 and in a manner spaced apart from one another by a slot in each case, the average width of which slot corresponds approximately to the average width of the individual first spring arms 21, 22 and 23.

In a fourth enhancement of the contact pin 100 according to the invention, additional mechanical stabilization of the contact pin according to the invention of elastic design is achieved in the state in which the device under test to be surveyed is inserted in the test base by the lateral widened portion 20 of the second end 111 of the first spring arm 21 in each case forming a plug-in connection with the second end 7 of the central region 1, and the lateral widened portion 23 of the second end 151 of the second spring arm 31 in each case forming a plug-in connection with the first end 5 and, respectively, with the second end 7 of the central region 1.

Figure 5A:
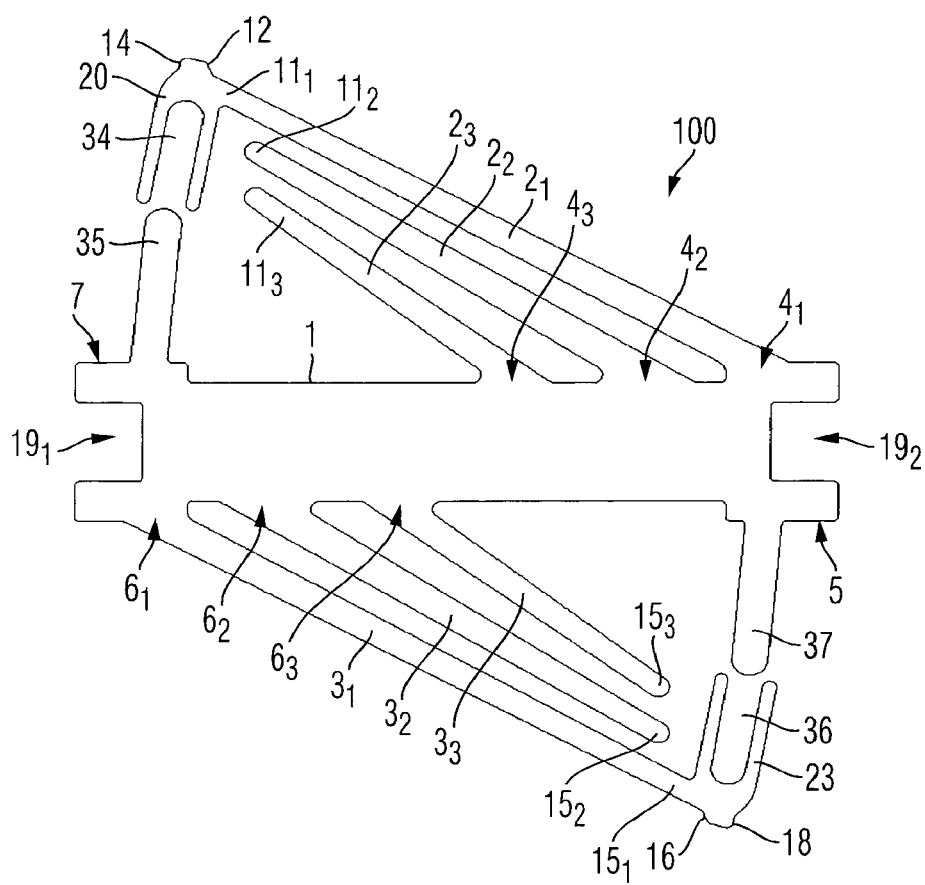
FIG. 5A shows an illustration of a first sub-variant of a fourth enhancement of a contact pin according to the invention.

In a first sub-variant of the fourth enhancement of the contact pin 100 according to the invention in line with FIG. 5A, which first sub-variant is based on the first sub-variant of the first enhancement of the contact pin according to the invention in line with FIG. 2A, a recess 34 is provided in the lateral widened portion 20 of the second end 111 of the first spring arm 21 for this purpose. A lateral widened portion 35 at the second end 7 of the central region 1 is introduced and inserted into this recess 34. In order that a plug-in connection is established between the lateral widened portion 35 of the central region 1 and the recess 34 in the lateral widened portion 20 of the second end 111 of the first spring arm 21, the lateral widened portion 35 of the central region 1 and the recess 34 in the lateral widened portion 20 of the first contact region 12 have approximately the same orientation and a shape which approximately corresponds to one another in the inserted state.

In an equivalent manner, a recess 36 is provided in the lateral widened portion 23 of the second end 151 of the second spring arm 31, a lateral widened portion 37 at the first end 5 of the central region 1 being introduced and inserted into said recess. The recess 36 in the lateral widened portion 23 of the second end 151 of the second spring arm 31 and the lateral widened portion 37 of the central region 1 also have approximately the same orientation and a shape which approximately corresponds to one another, so that a plug-in connection is reliably established between the lateral widened portion 37 of the central region 1 and the recess 36 in the lateral widened portion 23 of the second end 151 of the second spring arm 31.

Figure 5B:
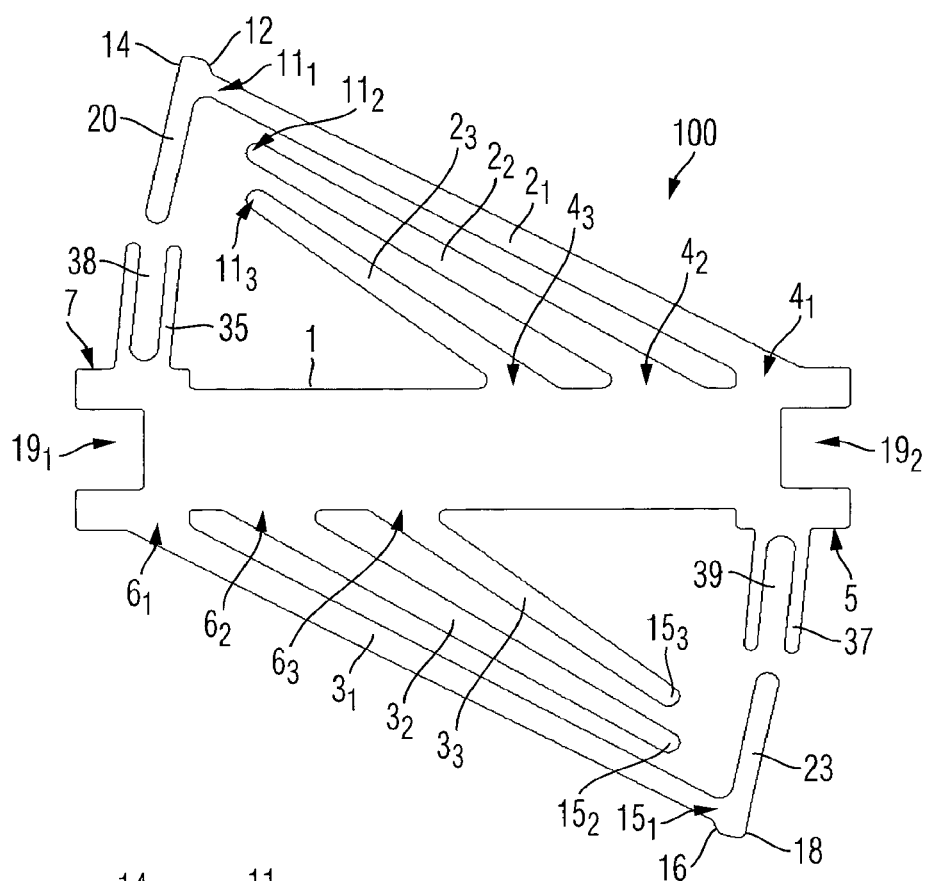
FIG. 5B shows an illustration of a second sub-variant of a fourth enhancement of a contact pin according to the invention.

In the second sub-variant of the fourth enhancement of the contact pin 100 according to the invention in line with FIG. 5B, the lateral widened portion 20 of the second end 111 of the first spring arm 21 is introduced and inserted into a recess 38 which is formed in a lateral widened portion 35 at the second end 7 of the central region 1. In order that a reliable plug-in connection is established between the lateral widened portion 20 of the second end 111 of the first spring arm 21 and the recess 38 in the lateral widened portion 35 of the central region 1, the lateral widened portion 20 and the recess 38 have approximately the same orientation and shapes which approximately correspond to one another in the inserted state.

In an equivalent manner, the lateral widened portion 23 of the second end 151 of the second spring arm 31 is introduced and inserted into a recess 39 which is formed in a lateral widened portion 37 at the first end 5 of the central region 1. It is also the case for the plug-in connection between the widened portion 23 and the recess 39 that the orientations of the widened portion 23 and of the recess 39 are approximately the same and the shapes of the widened portion 23 and of the recess 39 have shapes which approximately correspond to one another.

Figure 6A:
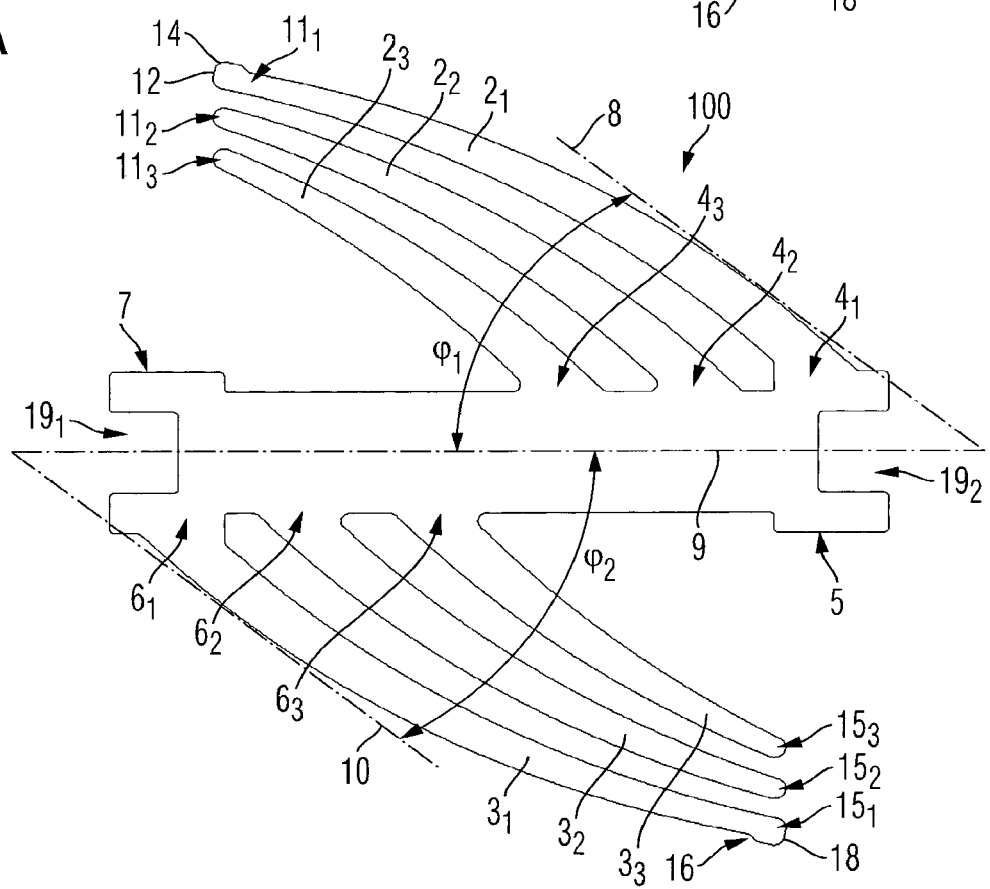
FIG. 6A shows an illustration of a second embodiment of a contact pin according to the invention.

Whereas in a first embodiment of the contact pin 100 according to the invention the individual first and second spring arms each have a linear profile, that is to say a rectilinear profile, in a second embodiment of the contact pin 100 according to the invention in line with FIG. 6A all of the first spring arms 21, 22 and 23 and all of the second spring arms 31, 32 and 33 are each bent in a concave manner in relation to the central region 1. The orientation of the individual first spring arms 21, 22 and 23 and of the individual second spring arms 31, 32 and 33 in the region of the respective first end 41, 42 and 43 and, respectively, 61, 62 and 63 in relation to the longitudinal axis 9 of the central region 1 is given by the angle φ1 and, respectively, φ2 between the tangent from the individual first spring arms 21, 22 and 23 and the individual second spring arms 31, 32 and 33 in the region of the respective first end 41, 42 and 43 and, respectively, 61, 62 and 63 and the longitudinal axis 9 of the central region 1. In the first embodiment of the contact pin 100 according to the invention, the angles φ1 and φ2 are each smaller than or equal to 90°.

An arrangement with any desired number of first and second spring arms, which can each be realized in the contact pin 100 according to the invention, in particular with a single first and a single second spring arm, is also covered by the invention in the second embodiment of the contact pin 100 according to the invention too.

Figure 6B:
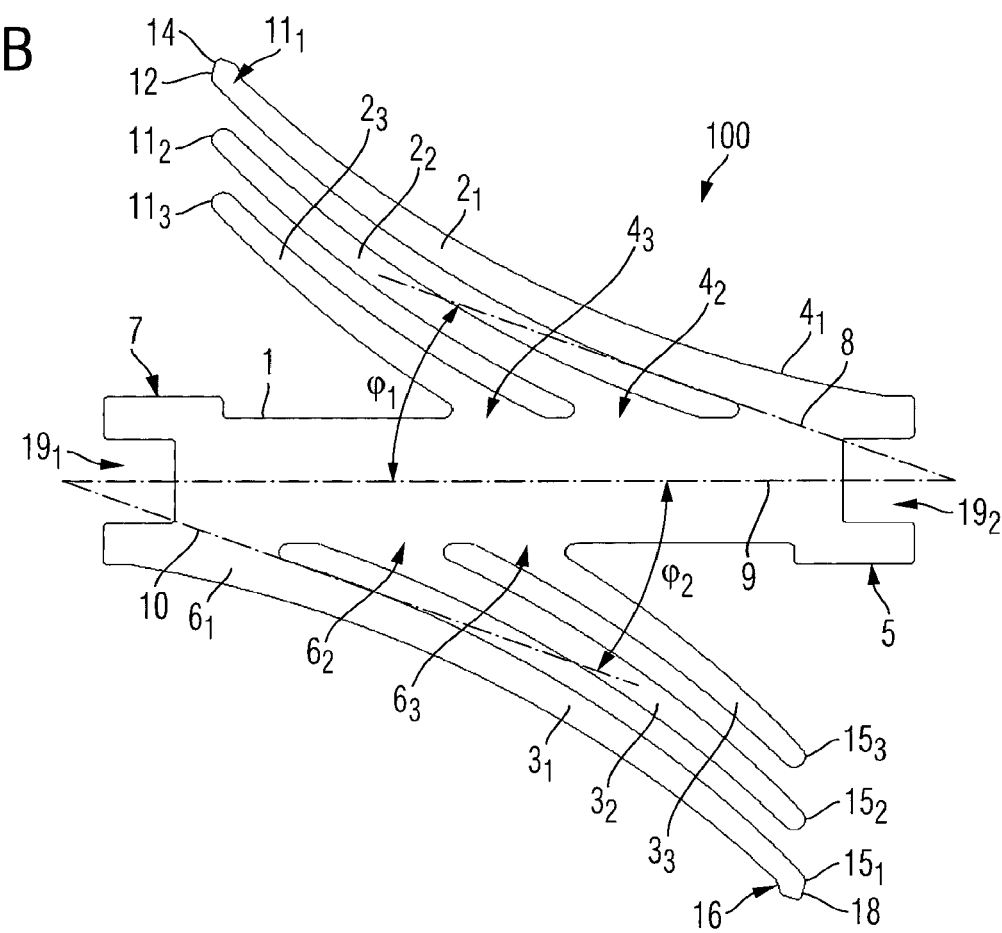
FIG. 6B shows an illustration of a third embodiment of a contact pin according to the invention.

In a third embodiment of the contact pin 100 according to the invention in line with FIG. 6B, the individual spring arms 21, 22 and 23 and the individual second spring arms 31, 32 and 33 are each bent in a convex manner in relation to the central region 1. The orientation of the individual first spring arms 21, 22 and 23 and of the individual second spring arms 31, 32 and 33 in the region of the respective first end 41, 42 and 43 and, respectively, 61, 62 and 63 of the respective first and, respectively, second spring arm 21, 22 and 23 and, respectively, 31, 32 and 33 in relation to the central region 1 is given by the angle φ1 and, respectively, φ2 between the tangent from the individual first spring arms 21, 22 and 23 and the individual second spring arms 31, 32 and 33 in the region of the respective first end 41, 42 and 43 and, respectively, 61, 62 and 63 and the longitudinal axis 9 of the central region 1. In the first embodiment of the contact pin 100 according to the invention, the angles φ1 and φ2 are each smaller than or equal to 90°.

For the third embodiment of the contact pin 100 according to the invention, any desired number of first and second spring arms which can each be realized in the contact pin 100 according to the invention, in particular a single first and a single second spring arm, is likewise also covered by the invention.

Figure 6C:
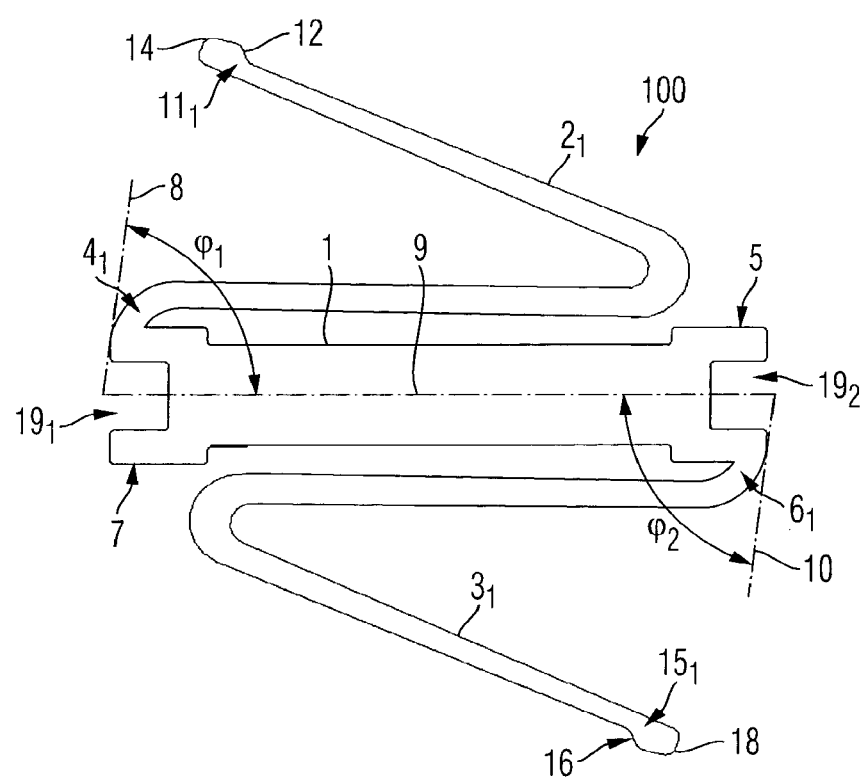
FIG. 6C shows an illustration of a fourth embodiment of a contact pin according to the invention.

In the fourth embodiment of the contact pin 100 according to the invention, the first spring arm 21 and the second spring arm 31 are each formed in a meandering manner in line with FIG. 6C.

As is clear from FIG. 6C, the first end 41 of the first spring arm 21 at the second end 7 of the central region 1 and the first end 61 of the second spring arm 31 at the first end 5 of the central region 1 are connected to the central region 1. As an alternative, the first ends 41 and 61 of the first and, respectively, the second spring arm 21 and, respectively, 31 can also be connected to the central region 1 at the opposite end 5 and, respectively, 7.

In addition to the first and second meandering spring arms 21 and 31, further first and second spring arms, not illustrated in FIG. 6C, can be provided, which further first and second spring arms are connected to the central region 1 in parallel relation to the first spring arm 21 and, respectively, to the second spring arm 31 and in a manner separated from one another by a slot in each case. These further first and second spring arms do not run entirely in a meandering manner and extend only as far as a region between the first and the second turn of the first and the second spring arm 21 and 31 along the first and, respectively, the second spring arm 21 and, respectively, 31.

The orientation of the first spring arm 21 and of the second spring arm 31 in the region of the respective first end 41 and, respectively, 61 of the first and, respectively, the second spring arm 21 and, respectively, 31 in relation to the central region 1 is given by the angle $\phi1$ and, respectively, $\phi2$ between the tangent from the individual first spring arms 21, 22 and 23 and the individual second spring arms 31, 32 and 33 in the region of the respective first end 41, 42 and 43 and, respectively, 61, 62 and 63 and the longitudinal axis 9 of the central region 1. In the fourth embodiment of the contact pin 100 according to the invention, the angles $\phi1$ and $\phi2$ are each smaller than or equal to 90°.

When a device under test to be surveyed is pushed into the test base, the first contact region 12 of the first spring arm 21 and the second contact region 16 of the second spring arm 31 each execute a rotary movement about their center of rotation, which center of rotation moves along the longitudinal axis 8 of the first spring arm 21, that is to say the axis between the first end 41 and the second end 111 of the first spring arm 21, or along the longitudinal axis 10 of the second spring arm 31, that is to say the axis between the first end 61 and the second end 151 of the second spring arm 31.

Figure 7:
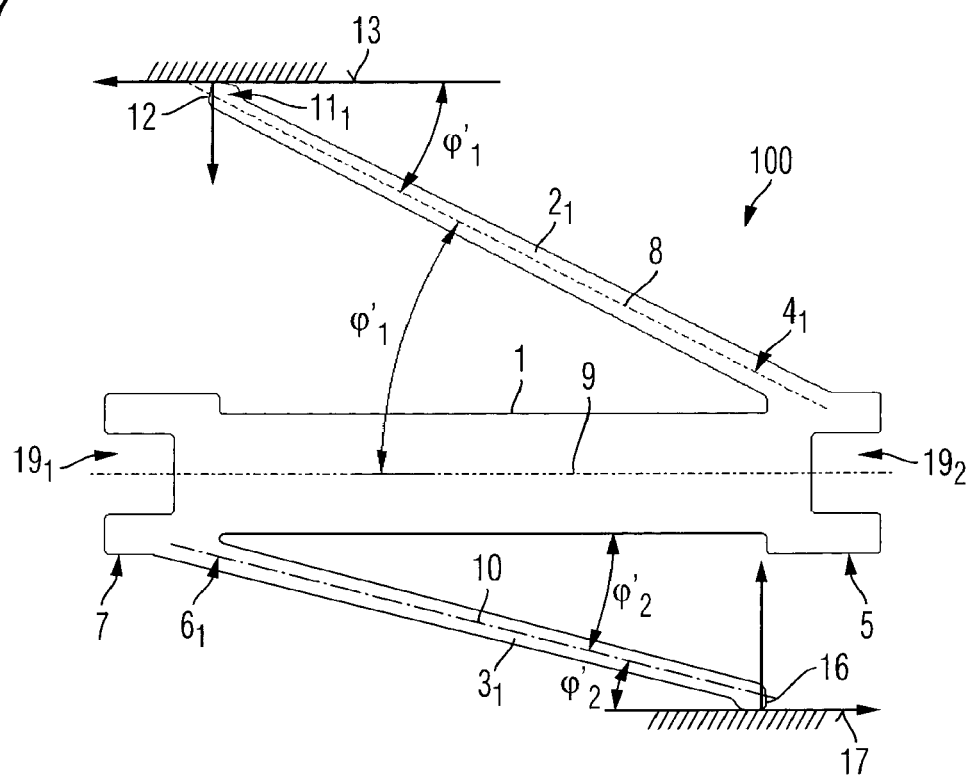
FIG. 7 shows an illustration of a contact pin according to the invention with different lengths of the abrasion paths on the individual contact sides.

This rotary movement of the first contact region 12 of the first spring arm 21 and of the second contact region 16 of the second spring arm 31 can in each case, as illustrated in FIG. 7, be broken down into two translatory movement components, specifically into a translatory movement component which runs parallel to the first or second contact area 13 or 17 and into a translatory movement component which runs perpendicular to the first or second contact area 13 or 17.

The translatory movement of the first contact region 12, which translatory movement runs parallel to the first contact area 13, is entirely desired on account of the associated advantageous scraping off of coatings on the first contact area 13. The translatory movement of the second contact region 16, which translatory movement runs parallel to the second contact area 17, is however not desired as much despite the abrasion of interfering coatings on the second contact area 17.

Whereas the first contact area 13 of each device under test which is pushed into the test base experiences an abrasion process of this kind when the device under test is pushed into the test base, the second contact area 17 in the test base is subjected to an abrasion process of this kind only when the test base is mounted on the loadboard.

Therefore, a considerably smaller abrasion movement is desired in the region of the second contact area 17, as is indicated in FIG. 7 by the considerably shorter length of the horizontal arrow at the contact zone 18 of the second contact region 16, than in the region of the first contact area 13, as can be seen in FIG. 7 by the considerably greater length of the horizontal arrow at the contact tip 14 of the first contact region 12.

In order to realize a translatory abrasion movement of the second contact region 16, which translatory abrasion movement runs parallel to the second contact area 16 and is considerably shorter than the translatory abrasion movement of the first contact region 12, which translatory abrasion movement runs parallel to the first contact area 13, the orientation angle $\phi2'$ between the longitudinal axis 10 of the second spring arm 31 and the longitudinal axis 9 of the central region 1 is to be designed to be considerably smaller than the orientation angle $\phi1'$ between the longitudinal axis 8 of the first spring arm 21 and the longitudinal axis 9 of the central region 1.

For the purpose of dimensioning the orientation angles $\phi1'$ and $\phi2'$ of the first spring arm 21 and, respectively, of the second spring arm 31, the following parameterization operations are preferably to be carried out:

The angle $\phi1'$ between the longitudinal axis 8 of the spring arm 21 and the longitudinal axis 9 of the central region 1 is larger, for example, by a factor of 1.5 than the angle $\phi2'$ between the longitudinal axis 10 of the second spring arm 31 and the longitudinal axis of the central region. The angle $\phi1'$ between the longitudinal axis 8 of the spring arm 21 and the longitudinal axis 9 of the central region 1 is preferably larger by a factor of 2.0 than the angle $\phi2'$ between the longitudinal axis 10 of the second spring arm 31 and the longitudinal axis 9 of the central region 1. The angle $\phi1'$ between the longitudinal axis 8 of the spring arm 21 and the longitudinal axis 9 of the central region 1 is particularly preferably larger by a factor of 2.5 than the angle $\phi2'$ between the longitudinal axis 10 of the second spring arm 31 and the longitudinal axis 9 of the central region 1.

The movement components of the first and, respectively, the second contact region 12 and, respectively, 16, which movevement components each run perpendicular to the first and the second contact area 13 and 17, are, in the case of the parameterization operations recommended above, approximately the same for the orientation angle $\phi1'$ between the longitudinal axis 8 of the spring arm 21 and the longitudinal axis 9 of the central region 1 and for the orientation angle $\phi2'$ between the longitudinal axis 8 of the spring arm 21 and the longitudinal axis 9 of the central region 1, as can be seen in FIG. 7.

In the case of the first embodiment of the contact pin according to the invention, that is to say with an approximately linear profile of the first and the second spring arm 21 and 22, the orientation angles $\phi1'$ and $\phi2'$ between the longitudinal axis 8 of the first spring arm 21 and, respectively, the longitudinal axis 10 of the second spring arm 31 and the longitudinal axis 9 of the central region 1 correspond to the associated orientation angles $\phi1$ and $\phi2$ of the first spring arm 21 and, respectively, of the second spring arm 31 in the region of the first end 41 of the first spring arm 21 and, respectively, in the region of the first end 61 of the second spring arm 31.

In the case of the second embodiment (concavely bent spring arms), the third embodiment (convexly bent spring arms) and the fourth embodiment (spring arms of meandering design), a relationship of this kind is no longer present. The orientation angles $\phi1'$ and $\phi2'$ between the longitudinal axis 8 of the first spring arm 21 and, respectively, the longitudinal axis 10 of the second spring arm 31 and the longitudinal axis 9 of the central region 1 have to be set separately from the associated orientation angles $\phi1$ and $\phi2$ of the first spring arm 21 and, respectively, of the second spring arm 31 in the region of the first end 41 of the first spring arm 21 and, respectively, in the region of the first end 61 of the second spring arm 31.

FIG. 9 shows, using dashed lines, the individual signal paths in the contact pin according to the invention if the object under test to be surveyed is pushed into the test base and the contact pin according to the invention is therefore in the compressed state. FIG. 9 illustrates a combination of a first enhancement of the contact pin according to the invention (a plurality of parallel first and second spring arms) and a fourth enhancement of the contact pin according to the invention (additional connection of the second end of the first and the second spring arm to the second and, respectively, the first end of the central region) and the use of the second embodiment for a contact pin according to the invention (concavely bent first and second spring arms).

The parallel signal paths firstly shorten the signal pathways of the high-frequency signal between the first and the second contact region and secondly reduce the ohmic losses within the contact pin. Therefore, the high-frequency transmission characteristic of the contact pin according to the invention is considerably improved overall.

Figure 8A:
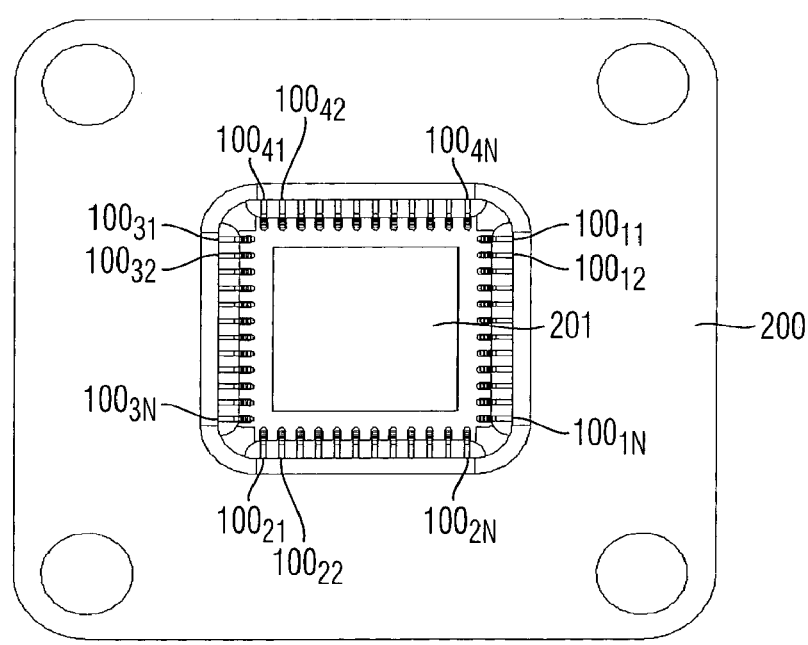
FIG. 8A shows an illustration of a test base according to the invention in plan view.

The test base according to the invention will be explained in detail below with reference to FIGS. 8A to 8D:

The plan view of FIG. 8A shows a test base 200 according to the invention, and in its center an insertion slot 201 for a device under test to be surveyed, in particular for an integrated circuit to be surveyed. The integrated circuit, not illustrated in FIG. 8A, substantially has a square base surface, a specific number of first contact areas 13 in each case being provided on the bottom side of said base surface in the region of the four sides. As an alternative, there may also be a rectangular base area of any desired dimensions, a specific number of first contact areas 13 in each case being provided on the bottom side of said base surface in the region of two or four sides. The first contact areas 13 which are provided on the bottom side of the integrated circuit are each in electrical contact with associated contact pins 100 according to the invention if the integrated circuit is inserted in the insertion slot 201 of the test base 200 according to the invention.

To this end, a specific number N of contact pins 10011, 10012, ... 1001N, 10021, 10022, ... 1002N, 10031, 10032, ..., 1003N, 10041, 10042, ..., 1004N according to the invention are respectively arranged in a total of four rows, as is illustrated in FIG. 8A. In the case of the integrated circuit which is inserted in the test base 200, the contact pins which are respectively arranged in a total of four rows are therefore in each case located beneath the four rows of first contact areas 13, which are provided on the bottom side at the four side edges of the integrated circuit to be surveyed, within the test base 200. In addition, contact pins which are in electrical contact with corresponding first contact areas can also be distributed in the region within the four rows, in particular in the center.

Figure 8B:
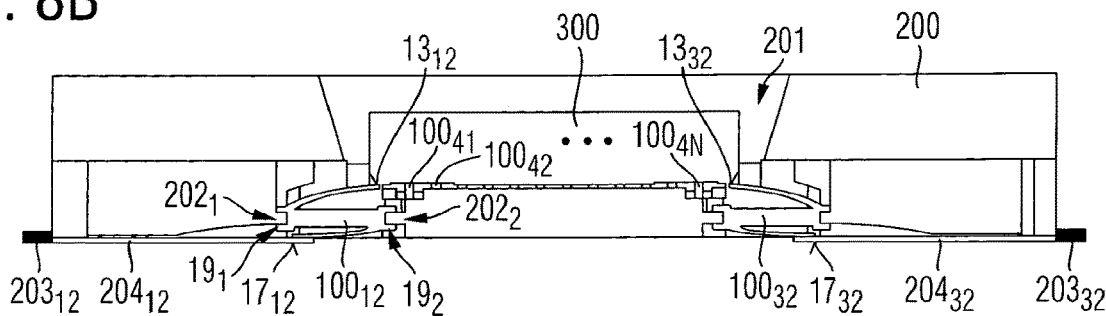
FIG. 8B shows a lateral cross-sectional illustration of a test base according to the invention.

In the lateral cross-sectional illustration of the test base 200 according to the invention in line with FIG. 8B, the device under test 300 which is to be surveyed, that is to say the integrated circuit 300 which is to be tested, is inserted in an insertion slot 201. In this illustration, by way of example, the two contact pins 10012 and 10032 according to the invention are illustrated in side view, and the contact pins 10041, 10042, ..., 1004N according to the invention are illustrated in front view.

While the contact pin 10012 according to the invention in the test base 200, by way of its first contact region 12, is in electrical contact with the first contact area 1312 of the integrated circuit 300 to be tested and, by way of its second contact region 16, is respectively in electrical contact with the second contact area 1712, there is in each case electrical contact between the first contact region 12 of the contact pin 10032 according to the invention and the first contact area 1332 of the integrated circuit 300 to be tested and between the second contact region 16 of the contact pin 10032 according to the invention and the second contact area 1732 in the test base 200.

Ideally, the individual second contact areas 17 extend as far as the bottom side of the test base 200 according to the invention and there form electrical connections for a respective connection to the loadboard, a printed circuit board which is referred to as a loadboard. This loadboard is either mechanically and electrically connected to the test base according to the invention or positioned separately in relation to the test base and to the measuring device and in each case connected to the test base and, respectively, to the measuring device via electrical lines.

As an alternative, as illustrated in FIG. 8B, the electrical connections can be arranged in the test base according to the invention at a distance from the associated second contact areas. In this case, the two second contact areas 1712 and 1732 are in each case electrically connected to the electrical connections 20312 and, respectively, 20332 via an electrical signal line 20412 and, respectively, 20432. By means of these electrical connections 20312 and 20332, test or measurement signals are exchanged between the "loadboard" and the first contact areas 1312 and, respectively, 1332 of the integrated circuit 300 to be tested for test purposes.

The mechanical fastening of the contact pin 10012 according to the invention to the test base 200 will be explained using the example of the contact pin 10012 according to the invention: the latching means 191 and 192, which are provided in each case at the first end, respectively, the second end 5 and, respectively, 7 of the central region 1 which forms part of the contact pin 10012 according to the invention, are in interlocking mechanical connection with corresponding latching means 2021 and 2022 of the test base 200 in each case.

Figure 8C:
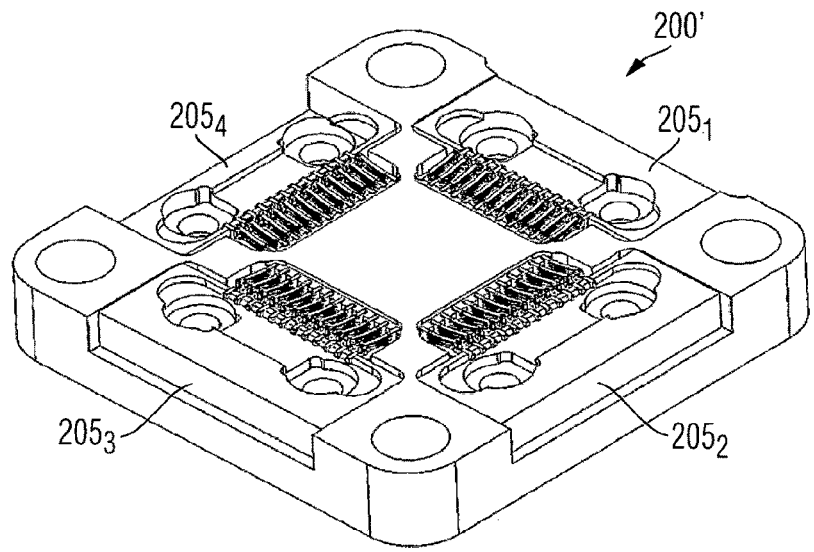
FIG. 8C shows a three-dimensional illustration of a test base according to the invention with embedded modules.
Figure 8D:
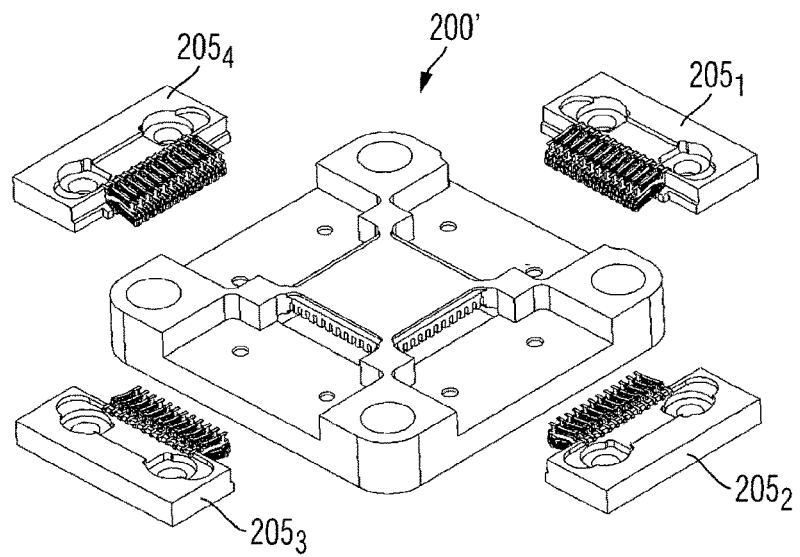
FIG. 8D shows a three-dimensional illustration of a test base according to the invention with removed modules.

FIGS. 8C and 8D each illustrate an embodiment of a test base 200' according to the invention in which the individual contact pins according to the invention of one row are in each case integrated in a separable module 2051, 2052, 2053 and 2054, which modules can each be embedded in the test base 200' according to the invention and therefore can be mechanically connected to the test base 200' according to the invention (see FIG. 8C) and can respectively also be removed from the test base 200' according to the invention again and therefore can be mechanically detached from the test base 200' according to the invention again (see FIG. 8D).

In addition to the individual contact pins according to the invention of one row, a separable module 2051, 2052, 2053 and 2054 of this kind in each case also contains the second contact areas 13, which are each associated with the individual contact pins 100, and latching means 2021 and 2022 and also optionally the electrical signal lines 204 and the electrical connections 205.

For the purpose of optimum and primarily homogeneous temperature control of all of the contact pins, air channels are preferably provided within the test base according to the invention, which air channels supply the individual contact pins with flushing air at a suitable temperature via suitably positioned connections to the test base.

In addition to the removal of the contact pins which are arranged in a in each case one row in a separable module 2051, 2052, 2053 and 2054 in each case, the removal of the contact pins which are arranged in all four rows overall in a single separable module in each case is also covered by the invention.

Finally, test bases with a different arrangement of the individual contact pins according to the invention, for example in a matrix or in a grid, are also covered by the invention. The option of integration of all of the contact pins according to the invention in a single separable module or the integration of sub-regions of respectively adjacent contact pins according to the invention in a separable module in each case is also covered by the invention here too.

The invention is not restricted to the illustrated embodiments, variants and sub-variants. In particular, all combinations of the features respectively disclosed in the description, of the features respectively claimed in the patent claims and of the features respectively illustrated in the figures of the drawing are also covered by the invention, provided that they are technically expedient.

The invention claimed is:

1. A contact, comprising:
an interconnect portion comprising a first end region and a second end region;
a first spring arm connected to said first end region on a first side of said interconnect portion and comprising a first contact surface;
a second spring arm connected to said second end region on a second side of said interconnect portion and comprising a second contact surface; and
a third arm connected to said first side of said interconnect portion, wherein
in a first state of said contact, said third arm does not constitute part of a first signal path from said first contact surface to said second contact surface, and
in a second state of said contact, said third arm constitutes part of a second signal path from said first contact surface to said second contact surface that is shorter than said first signal path.

2. The contact of claim 1, wherein:
said third arm is connected to said second end region of said interconnect portion.

3. The contact of claim 1, wherein:
said third arm is connected to said interconnect portion in a region intermediate said first spring arm and said second end region.

4. The contact of claim 1, comprising:
a fourth arm connected to said second side of said interconnect portion, wherein
in said second state, said fourth arm constitutes part of said second signal path.

5. The contact of claim 4, wherein:
in said first state, said fourth arm does not constitute part of said first signal path.

6. The contact of claim 4, wherein:
said second spring arm comprises a first branch and a second branch, and
said second branch, in said second state, contacts said fourth arm to form part of said second signal path.

7. The contact of claim 5, wherein:
said first branch, in said first state, electrically connects said interconnect portion to said second contact surface, and
said second branch is generally parallel to said first branch.

8. The contact of claim 1, wherein:
said first spring arm comprises a first branch and a second branch, and
said second branch, in said second state, contacts said third arm to form part of said second signal path.

9. The contact of claim 8, wherein:
said first branch, in said first state, electrically connects said interconnect portion to said first contact surface, and
said second branch is generally parallel to said first branch.

10. The contact of claim 1, wherein:
said first contact surface and said second contact surface are located distal from said interconnect portion.

11. The contact of claim 1, wherein:
said first end region comprises a first socket engagement structure, and
said second end region comprises a second socket engagement structure.

12. An integrated circuit test socket, comprising:
a plurality of contacts, wherein
each of said plurality of contacts comprises:
an interconnect portion comprising a first end region and a second end region;
a first spring arm connected to said first end region on a first side of said interconnect portion and comprising a first contact surface;
a second spring arm connected to said second end region on a second side of said interconnect portion and comprising a second contact surface; and
a third arm connected to said first side of said interconnect portion, said third arm, in a first state of the respective contact, not constituting part of a first signal path from the respective first contact surface to the respective second contact surface, and said third arm, in a second state of the respective contact, constituting part of a second signal path from the respective first contact surface to the respective second contact surface that is shorter than said first signal path.

13. The test socket of claim 12, comprising:
a plurality of pins, wherein
for each of said plurality of contacts, said first contact surface of the respective contact contacts a respective one of said pins.

14. The test socket of claim 12, comprising:
a first frame member;
a second frame member, wherein
for each of said plurality of contacts, said first end region of the respective interconnect portion comprises a first socket engagement structure that engages said first frame member and said second end region of the respective interconnect portion comprises a second socket engagement structure that engages said second frame member.

15. The test socket of claim 12, wherein:
the respective second contact surfaces of said plurality of contacts are situated substantially in a first plane so as to individually contact respective contacts formed on a planar surface of an integrated circuit received by said test socket.

16. The test socket of claim 15, wherein:
the respective first contact surfaces of said plurality of contacts are situated substantially in a second plane substantially parallel to said first plane.

17. The test socket of claim 12, wherein:
for each of said plurality of contacts, said third arm of the respective contact is connected to said second end region of said interconnect portion of the respective contact.

18. A contact, comprising:
a first spring arm comprising a first distal portion comprising a first contact surface;
a second spring arm comprising a second distal portion comprising a second contact surface electrically connected to said first contact surface;
a third arm; and
an interconnect portion that mechanically interconnects said first spring arm, said second spring arm and said third arm, wherein
said first spring arm protrudes from a first end region of said interconnect portion, said third arm protrudes from a second end region of said interconnect portion, said first distal portion is resiliently deflectable toward said interconnect portion from an undeflected state in which said first spring arm does not directly contact said third arm to a deflected state in which said first spring arm contacts said third arm.

19. The contact of claim 18, wherein:

said first spring arm and said third arm protrude from a first side of said interconnect portion, said second spring arm protrudes from a second side of said interconnect portion, and said second spring arm protrudes from said second end region of said interconnect portion.

20. The contact of claim 19, comprising:

a fourth arm, wherein said fourth arm protrudes from said second side of said interconnect portion in said first end region of said interconnect portion, said second distal portion is resiliently deflectable toward said interconnect portion from an undeflected state in which said second spring arm does not directly contact said fourth arm to a deflected state in which said second spring arm contacts said fourth arm.

21. The contact of claim 18, wherein:

in said deflected state, said contacting of said first spring arm and said third arm establishes a signal path between said first contact surface and said second contact surface via said third arm.

\* \* \* \* \*